United States Patent
Li et al.

(10) Patent No.: US 7,446,393 B2
(45) Date of Patent: Nov. 4, 2008

(54) CO-SPUTTER DEPOSITION OF METAL-DOPED CHALCOGENIDES

(75) Inventors: Jiutao Li, Boise, ID (US); Allen McTeer, Meridian, ID (US); Gregory Herdt, Boise, ID (US); Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 11/710,517

(22) Filed: Feb. 26, 2007

(65) Prior Publication Data
US 2007/0164398 A1 Jul. 19, 2007

Related U.S. Application Data

(62) Division of application No. 10/878,060, filed on Jun. 29, 2004, now Pat. No. 7,202,104, which is a division of application No. 10/164,429, filed on Jun. 6, 2002, now Pat. No. 6,890,790.

(51) Int. Cl.
*H01L 29/20* (2006.01)
(52) U.S. Cl. ...................... 257/616; 257/762
(58) Field of Classification Search ................. 257/616, 257/762
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |

(Continued)

FOREIGN PATENT DOCUMENTS

JP 5-6126916 10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

(Continued)

*Primary Examiner*—Douglas M Menz
(74) *Attorney, Agent, or Firm*—Dickstein Shapiro LLP

(57) ABSTRACT

The present invention is related to methods and apparatus that allow a chalcogenide glass such as germanium selenide ($Ge_xSe_{1-x}$) to be doped with a metal such as silver, copper, or zinc without utilizing an ultraviolet (UV) photodoping step to dope the chalcogenide glass with the metal. The chalcogenide glass doped with the metal can be used to store data in a memory device. Advantageously, the systems and methods co-sputter the metal and the chalcogenide glass and allow for relatively precise and efficient control of a constituent ratio between the doping metal and the chalcogenide glass. Further advantageously, the systems and methods enable the doping of the chalcogenide glass with a relatively high degree of uniformity over the depth of the formed layer of chalcogenide glass and the metal. Also, the systems and methods allow a metal concentration to be varied in a controlled manner along the thin film depth.

5 Claims, 4 Drawing Sheets

U.S. PATENT DOCUMENTS

| | | |
|---|---|---|
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |

| | | |
|---|---|---|
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarthy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zeroual, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Dicovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol.(a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliot, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J.; Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Homlquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Depositon*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technolgoy Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayam, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.; Hajto,J.;Lecomber,P.G.;Gage,S.M.;Choi,W.K.;Snell,A.J.;Owen,A.E., Amorphous Silicon Analogue Memory Devices, J. Non-Cryst. Solids 115 (1989) 168-170.

Rose,M.J.;Snell,A.J.;Lecomber,P.G.; Hajto,J.;Fitzgerald,A.G.;Owen,A.E., Aspects of Non-volatility in a-Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chacogneide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H.;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semimconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope|dTg/d<m>| at the Rigidity Percolation Threshold (<m>=2.4), J. Non-Cryst. Solids 151 (1992) 149-154.

CO-SPUTTER DEPOSITION OF METAL-DOPED CHALCOGENIDES

RELATED APPLICATION

This application is a divisional of U.S. patent application Ser. No. 10/878,060, filed Jun. 29, 2004, now U.S. Pat. No. 7,202,104 which is a divisional of U.S. patent application Ser. No. 10/164,429, filed Jun. 6, 2002, now U.S. Pat. No. 6,890,790 the entirety of each is hereby incorporated by reference. This application is also related to the disclosure of U.S. application Ser. No. 10/164,646, now U.S. Pat. No. 6,825,135 the entirety of which is hereby incorporated by reference.

BACKGROUND OF THE INVENTION

1. Field of the Invention

The present invention generally relates to memory technology. In particular, present invention relates to the fabrication of metal-doped chalcogenides.

2. Description of the Related Art

Computers and other digital systems use memory to store programs and data. A common form of memory is random access memory (RAM). Many memory devices, such as dynamic random access memory (DRAM) devices and static random access memory (SRAM) devices are volatile memories. A volatile memory loses its data when power is removed. In addition, certain volatile memories such as DRAM devices require period refresh cycles to retain their data even when power is continuously supplied.

In contrast to the potential loss of data encountered in volatile memory devices, nonvolatile memory devices retain data for long periods of time when power is removed. Examples of nonvolatile memory devices include read only memory (ROM), programmable read only memory (PROM), erasable programmable read only memory (EPROM), electrically erasable programmable read only memory (EEPROM), and the like.

U.S. Pat. No. 6,084,796 to Kozicki, et al., entitled "Programmable metallization cell structure and method of making same," discloses another type of non-volatile memory device known as a programmable conductor memory cell or a programmable metallization cell (PMC). U.S. Pat. No. 6,084,796 is herein incorporated by reference in its entirety. Such memory cells can be integrated into a memory device, which has been referred to as a programmable conductor random access memory (PCRAM). A chalcogenide glass element is doped with metal, preferably silver (Ag). Application of an electric field with a first polarity causes a conductive pathway to grow along the sidewalls or in the sidewalls of the glass element, whereas an electric field of the opposite polarity dissolves the conductive pathway back into the glass element. If the conductive pathway extends between electrodes at opposite ends of the glass element, the resulting short or relatively low resistance can represent a logic state, e.g., a "1" state for the memory cell, whereas the unshorted, relatively high resistance state can represent another logic state, e.g., a "0" state. Additional applications for a programmable metallization cell include use as a variable programmable resistance and a variable programmable capacitance.

One conventional technique for producing the programmable conductor memory cell applies silver (Ag) photodoping to a chalcogenide glass such as germanium selenide ($Ge_3Se_7$). The silver (Ag) photodoping process deposits silver (Ag) over germanium selenide ($Ge_3Se_7$) and exposes the underlying substrate assembly to a relatively intense source of ultraviolet (UV) radiation for an extended period of time, such as 15 minutes. Disadvantageously, the photodoping process is relatively time-consuming and can slow semiconductor fabrication rates. The photodoping process can decrease the overall process rate especially when it is repetitively applied, such as in the fabrication of a multiple layer stack. Further disadvantageously, the extended exposure to intense UV radiation can induce the glass to convert from an amorphous material to a crystallized material, which thereby results in reduced yields.

Another disadvantage to producing memory cells with silver (Ag) photodoping of glasses is that relatively precise control of the amount of silver (Ag) that is photodiffused into the glass is necessary. A sufficient amount of silver (Ag) must be incorporated into the glass backbone and yet, the glass must not crystallize. If too much silver (Ag) is photodiffused into the glass, the glass crystallizes. If too little silver (Ag) were to be photodiffused into the glass, the memory cell would not switch properly.

Another disadvantage to the photodoping process is that the ultraviolet light is attenuated by the silver film as the ultraviolet light penetrates through the silver film. Such attenuation varies exponentially with the thickness of the film. In one example, with 300 nanometers (nm) wavelength ultraviolet radiation, the intensity of the ultraviolet radiation decreases to only about 10% of its initial intensity after penetrating through 650 angstroms (Å) of silver film. This attenuation renders photodoping to be impractical with relatively thick films, and requires relatively precise control of the thicknesses of the silver (Ag) and chalcogenide glass films. In order to form a thick film with a UV photodoping process, the UV photodoping process is disadvantageously applied repetitively to relatively thin films of silver (Ag). In addition, the varying attenuation of the ultraviolet light continues as the silver (Ag) dopes the chalcogenide glass. Further disadvantageously, this attenuation in intensity of the ultraviolet light as the ultraviolet light penetrates material results in a non-uniform depth profile of the doped silver (Ag) in the chalcogenide glass.

SUMMARY OF THE INVENTION

Embodiments of the present invention include systems and methods that overcome the disadvantages of the prior art. The systems and methods described herein allow a chalcogenide glass, such as germanium selenide ($Ge_xSe_{1-x}$), to be doped with a metal such as silver (Ag), copper (Cu), and zinc (Zn), without utilizing an ultraviolet (UV) photodoping step to dope the chalcogenide glass with the metal. Other examples of chalcogenide glasses that can be used include germanium sulfide ($Ge_xS_{1-x}$) and arsenic selenide ($As_xSe_{1-x}$). Advantageously, embodiments of the invention co-sputter the metal and the chalcogenide glass and allow for relatively precise and efficient control of a constituent ratio between the doping metal and the chalcogenide glass. Further advantageously, the systems and methods enable the doping of the chalcogenide glass with a relatively high degree of depth-profile uniformity. Also, the systems and methods allow a metal concentration to be varied in a controlled manner along the thin film depth.

One embodiment according to the present invention is a nonvolatile memory cell including a first electrode, a second electrode, and a memory cell body disposed between the first electrode and the second electrode. The memory cell body includes a layer of germanium selenide ($Ge_xSe_{1-x}$) that is uniformly doped over depth with a metal such as silver (Ag), copper (Cu), or zinc (Zn).

Another embodiment according to the present invention is a deposition system adapted to fabricate a nonvolatile memory cell body in a substrate assembly. The deposition system includes a deposition chamber, a first target, and a second target. The deposition chamber is adapted to hold the substrate assembly. The deposition system is further configured to sputter metal from the first target and to sputter germanium selenide ($Ge_xSe_{1-x}$) from the second target at the same time to co-deposit the metal and the germanium selenide ($Ge_xSe_{1-x}$). In one arrangement, the deposition system sputters silver (Ag) from the first target. In another arrangement, the deposition system sputters copper (Cu) or zinc (Zn) from the first target. The deposition system can further include a control configured to control the deposition rate of the metal and the deposition rate of the germanium selenide such that the nonvolatile memory cell body is deposited at a selected ratio between the metal and the germanium selenide in the cell body.

Another embodiment according to the present invention is a process of fabricating a nonvolatile memory structure in a substrate assembly. The process includes forming a bottom electrode, co-sputtering metal and germanium selenide ($Ge_xSe_{1-x}$), and forming a top electrode. In other embodiments, a metal selenide and germanium; selenium and a mixture of a metal and germanium; or a metal, germanium, and selenium are co-sputtered.

Another embodiment according to the present invention is a process of forming a layer in a substrate assembly. The layer is capable of supporting the growth conductive pathways in the presence of an electric field. The process includes providing elemental silver (Ag) in a first sputtering target, providing germanium selenide ($Ge_xSe_{1-x}$) in a second sputtering target, selecting a first sputtering rate for silver (Ag), selecting a second sputtering rate for germanium selenide ($Ge_xSe_{1-x}$), sputtering the silver (Ag), and sputtering the germanium selenide ($Ge_xSe_{1-x}$) at the same time as sputtering the silver to produce the layer.

Advantageously, the co-sputter deposition of silver (Ag) and germanium selenide ($Ge_xSe_{1-x}$) allows the silver (Ag) to dope the sputtered germanium selenide ($Ge_xSe_{1-x}$) in the layer with a relatively uniform depth profile. In one arrangement, the first sputtering rate is determined by selecting a first sputtering power for silver (Ag), and the second sputtering rate is determined by selecting a second sputtering power for germanium selenide ($Ge_xSe_{1-x}$). The process preferably further includes selecting a ratio between the silver (Ag) and the germanium selenide in the layer, using the ratio to determine the first sputtering rate, and using the ratio to determine the second sputtering rate.

Another embodiment according to the present invention is a process that controls a constituent ratio during production of a memory cell body. The ratio is controlled by selecting a first deposition rate of a metal such as silver (Ag), copper (Cu), or zinc (Zn) selecting a second deposition rate of germanium selenide ($Ge_xSe_{1-x}$), controlling the first deposition rate by selecting a first sputtering power used to deposit the metal, and controlling the second deposition rate by selecting a second sputtering power used to deposit the germanium selenide ($Ge_xSe_{1-x}$).

Another embodiment according to the present invention is a process to configure a deposition system used to fabricate a memory cell body for a nonvolatile memory cell. The process includes receiving an indication of a desired constituent ratio, and calculating a deposition rate for a metal and a deposition rate for germanium selenide ($Ge_xSe_{1-x}$) that provides the desired ratio. The calculated deposition rate for the metal is further related to a sputter power for a metal target, and the calculated deposition rate for germanium selenide ($Ge_xSe_{1-x}$) is related to a sputter power for a germanium selenide ($Ge_xSe_{1-x}$) target. The process configures the deposition system to sputter the metal from the metal target at the calculated sputter power, and configures the deposition system to sputter germanium selenide ($Ge_xSe_{1-x}$) from the germanium selenide ($Ge_xSe_{1-x}$) target with the calculated sputter power. The metal can be silver (Ag), copper (Cu), or zinc (Zn). In another embodiment, the process includes storing a configuration of the deposition chamber, measuring the deposition rate for the metal versus sputter power, measuring the deposition rate for germanium selenide ($Ge_xSe_{1-x}$) versus sputter power, and storing the measured information such that it can be later retrieved by the process to configure the deposition system.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

DETAILED DESCRIPTION OF THE PREFERRED EMBODIMENTS

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the present invention is defined only by reference to the appended claims.

Embodiments of the present invention allow a chalcogenide glass such as germanium selenide ($Ge_xSe_{1-x}$) to be doped with a metal such as silver (Ag), copper (Cu), or zinc (Zn) without the performance of an ultraviolet (UV) photodoping step. Other examples of chalcogenide glasses that can be used include germanium sulfide ($Ge_xS_{1-x}$) and arsenic selenide ($As_xSe_{1-x}$). The value of x can vary in a wide range. Although the value of x can theoretically range from 0 to 1, the fabrication of a programmable conductor random access memory (PCRAM) should maintain the value of x such that the underlying combination of chalcogenide glass doped with the metal remains in an amorphous state. It will be understood by one of ordinary skill in the art that the value of x can depend on the amount of the metal that dopes the chalcogenide glass. The selection of a value of x will be described later in connection with FIG. 2.

Advantageously, embodiments of the invention co-sputter the metal and the chalcogenide glass. This provides a relatively precise and efficient control of a constituent ratio between the doping metal and the chalcogenide glass. Further advantageously, the doping of the chalcogenide glass with the metal can be produced with a relatively high degree of depth profile uniformity. It will be understood by one of ordinary skill in the art that there are at least two types of uniformity with respect to a doping profile. A first type, a lateral doping profile, varies depending on the deposition system. For example, variations in the projected light intensity of an ultraviolet source across the surface of the deposited film can produce lateral variations in the doping profile. By contrast, the attenuation of the ultraviolet light as the ultraviolet light penetrates through the metal and the chalcogenide glass gives rise to variations in depth profile uniformity.

Figure 1:
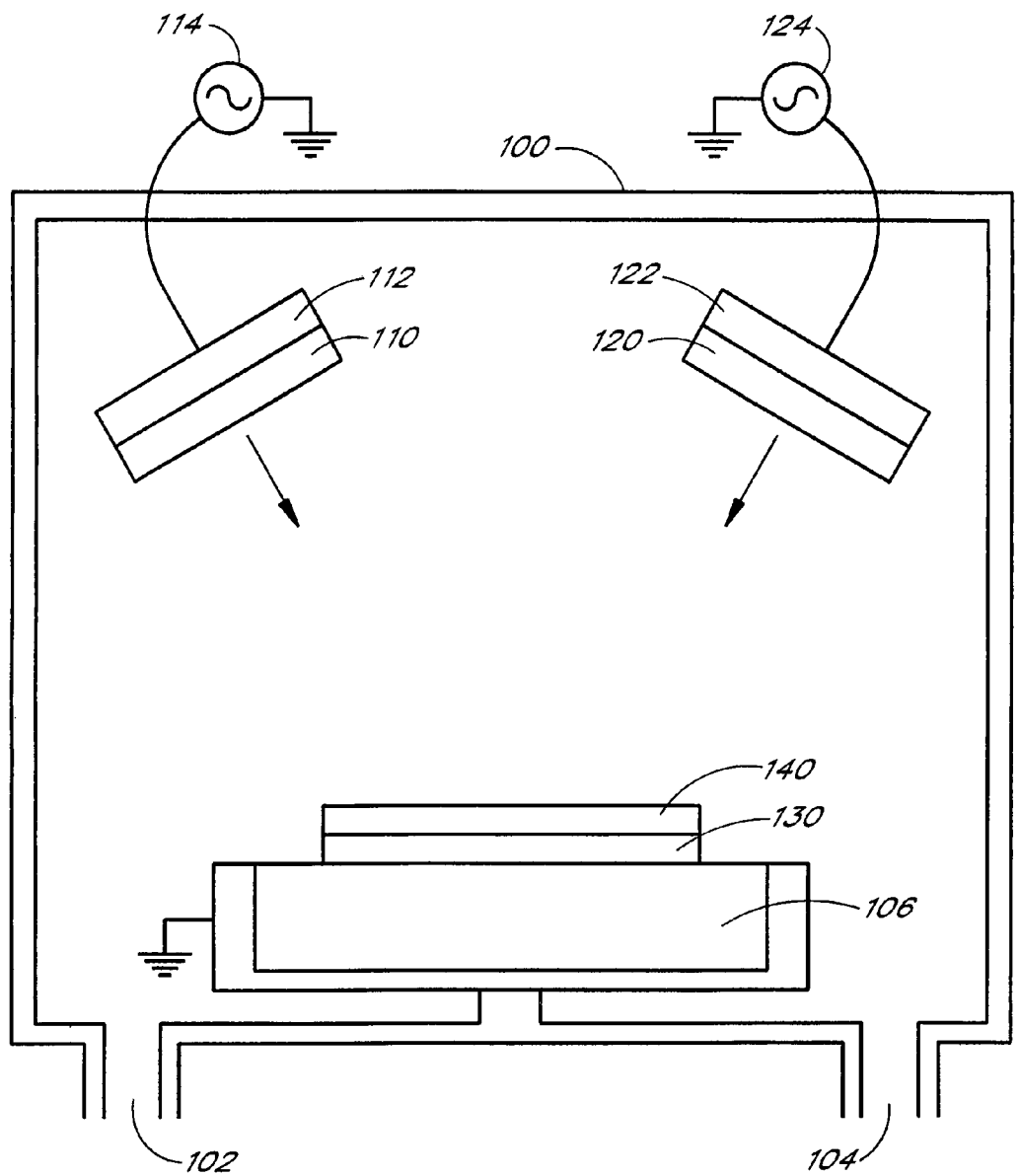
FIG. 1 schematically illustrates a co-sputter deposition system according to an embodiment of the present invention.

FIG. 1 schematically illustrates a co-sputter deposition system 100 according to an embodiment of the present invention. The illustrated co-sputter deposition system 100 includes a first inlet 102 adapted to introduce an inert gas, such as argon (Ar). A second inlet 104 allows a vacuum pump to evacuate an interior of the co-sputter deposition system 100 to a relatively low pressure.

A first target 110 provides a source of chalcogenide glass, preferably germanium selenide ($Ge_xSe_{1-x}$). The first target 110 is coupled to a first target electrode 112, which in turn is coupled to a first power supply 114. In one arrangement, the first power supply 114 is configured to pulse direct current (DC) to sputter material from .the first target 110. In one arrangement, the first target 110 is germanium selenide ($Ge_xSe_{1-x}$), e.g., $Ge_3Se_7$.

A second target 120 provides the source of the metal that dopes the germanium selenide ($Ge_xSe_{1-x}$). The metal can be silver (Ag), copper (Cu), and zinc (Zn), which will advantageously diffuse relatively quickly into the chalcogenide element. The second target 120 is coupled to a second target electrode 122, which in turn is coupled to a second power supply 124. In one arrangement, the second power supply 124 is configured to apply direct current, (DC) to sputter material from the second target 120.

The co-sputter deposition system 100 sputters chalcogenide glass from the first target 110 and simultaneously sputters the metal from the second target 120 to a substrate 130 to produce a layer 140 of chalcogenide glass doped with the metal. In the illustrated co-sputter deposition system 100, the substrate 130 rests on an electrode 106, which is at ground potential. The relative removal rates and thus, deposition rates, of material from the target 110 and the second target 120 approximately determine the doping profile of the layer 140.

Figure 2:
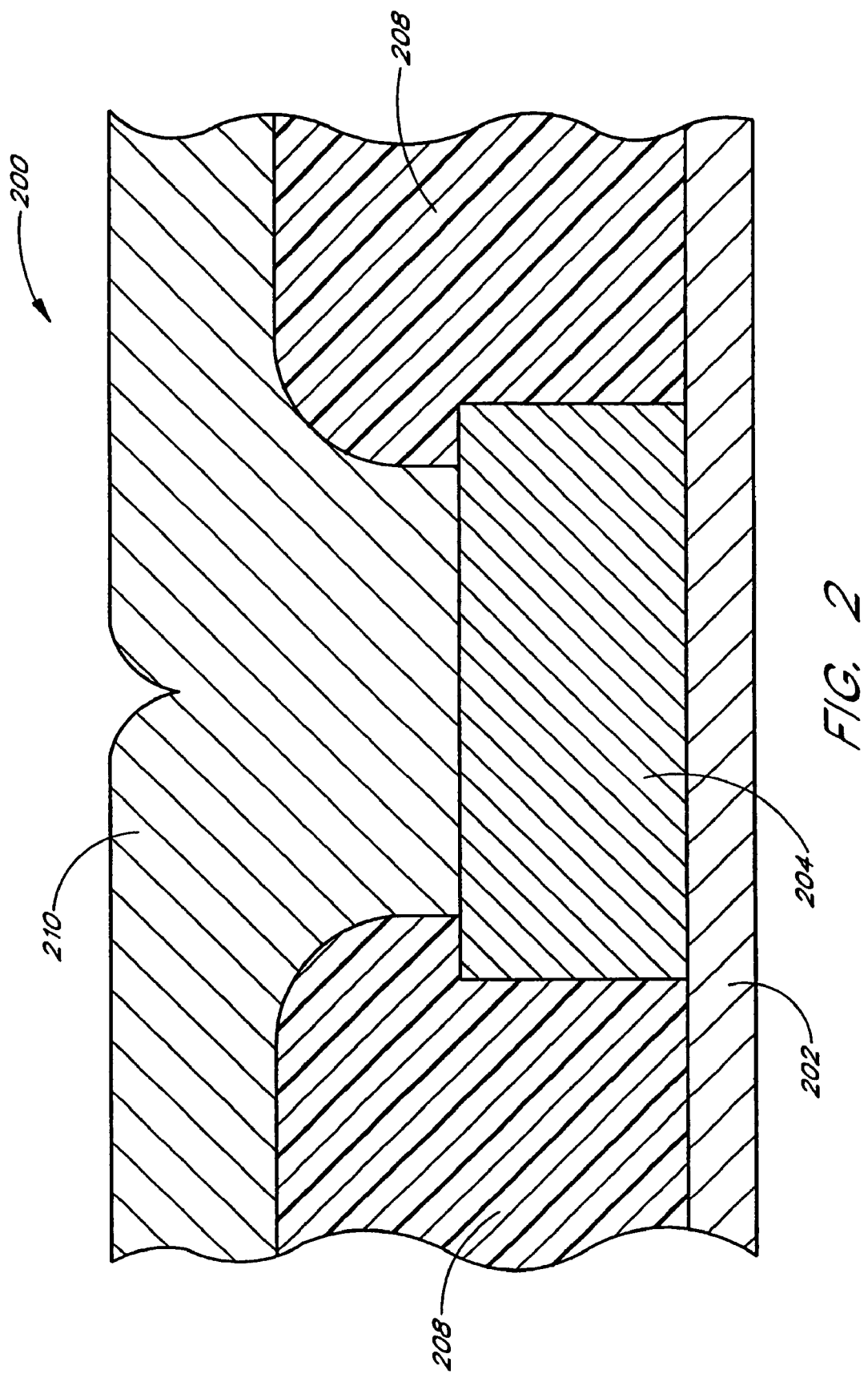
FIG. 2 is a schematic cross section of a memory cell with a memory cell body formed by co-sputtering a metal and germanium selenide ($Ge_xSe_{1-x}$) glass.

FIG. 2 illustrates one embodiment according to the present invention of a memory cell 200 with an active layer formed by co-sputtering metal and a chalcogenide glass. In one embodiment, the metal is silver (Ag). In other embodiments, the metal is copper (Cu) or zinc (Zn). In one embodiment, the chalcogenide glass is germanium selenide ($Ge_xSe_{1-x}$), e.g., $Ge_3Se_7$. The illustrated memory cell 200 includes a first electrode 202, a memory cell body 204, an insulator 208, and a second electrode 210.

The first electrode 202 is formed on a substrate assembly. The substrate assembly can correspond to a variety of materials including plastic and silicon. Preferably, the first electrode 202 is part of an elongated conductor in a crosspoint array so that the memory cell 200 can be programmed and read. The first electrode 202 can be made from a variety of materials and from combinations of materials such as tungsten (W), nickel (Ni), silver (Ag), and titanium (Ti).

The memory cell body 204 is formed on the first electrode 202. In the illustrated embodiment, the memory cell body 204 is a co-sputtered layer of silver (Ag) and germanium selenide ($Ge_xSe_{1-x}$). In another embodiment, the memory cell body 203 is a co-sputtered layer of copper (Cu) and germanium selenide ($Ge_xSe_{1-x}$) or a co-sputtered layer of zinc (Zn) and germanium selenide ($Ge_xSe_{1-x}$). A variety of combinations of metal and chalcogenide glass elements can be used to form the memory cell body 204. In another embodiment, the metal and chalcogenide glass elements are co-sputtered from three separate targets, e.g., a silver target, a germanium target, and a selenium target.

The memory cell body 204 of the memory cell 200 should be formed such that the metal-doped chalcogenide glass in the memory cell body 204 is in an amorphous state. The skilled practitioner will appreciate that where the chalcogenide glass is germanium selenide ($Ge_xSe_{1-x}$), the state of the metal-doped chalcogenide glass, i.e., whether it is amorphous or crystalline, depends on both the value of x and the amount of metal that dopes the chalcogenide glass.

A phase diagram can be used to select a value for x and to silt the amount of metal that is to dope the chalcogenide glass such that the chalcogenide glass remains amorphous. Such a phase diagram can be found in a reference from Mitkova, et al., entitled "Dual Chemical Role of Ag as an Additive in Chalcogenide Glasses," *Physical Review Letters*, Vol. 86, no. 19, (Nov. 8, 1999), pp. 3848-3851, ("Mitkova") which is attached hereto as Appendix 1 and which is hereby incorporated herein by reference in its entirety. FIG. 1 of Mitkova illustrates two glass-forming or amorphous regions for germanium selenide ($Ge_xSe_{1-x}$) doped with silver (Ag). In one example, where x is 30, i.e., 0.30, so that the germanium selenide glass is $Ge_{30}Se_{70}$, the amount of silver (Ag) used to dope the germanium selenide should fall within about 0 to 18% or within about 23% to 32% by atomic percentage versus the amount of selenide (Se).

In the illustrated embodiment, the insulator 208 surrounds the memory cell body 204. The insulator 208 insulates the memory cell body 204 from other memory cells and also prevents the undesired diffusion of metal atoms and ions. The insulator 208 can be formed from a variety of materials such as silicon nitride ($Si_3N_4$).

The second electrode 210 is formed on the memory cell body 204 and on the insulator 208. In one embodiment, the second electrode 210 also forms part of a line, preferably perpendicular to a lower line as part of a crosspoint array. The second electrode 210 can be formed from a variety of materials such as copper (Cu), zinc (Zn), silver (Ag), and the like. An electric potential applied between the first electrode 202 and the second electrode 210 generates an electric field in the memory cell body 204, which in turn causes conductive pathways in the memory cell body 204 to grow or shrink in response to the applied electric field.

Figure 3:
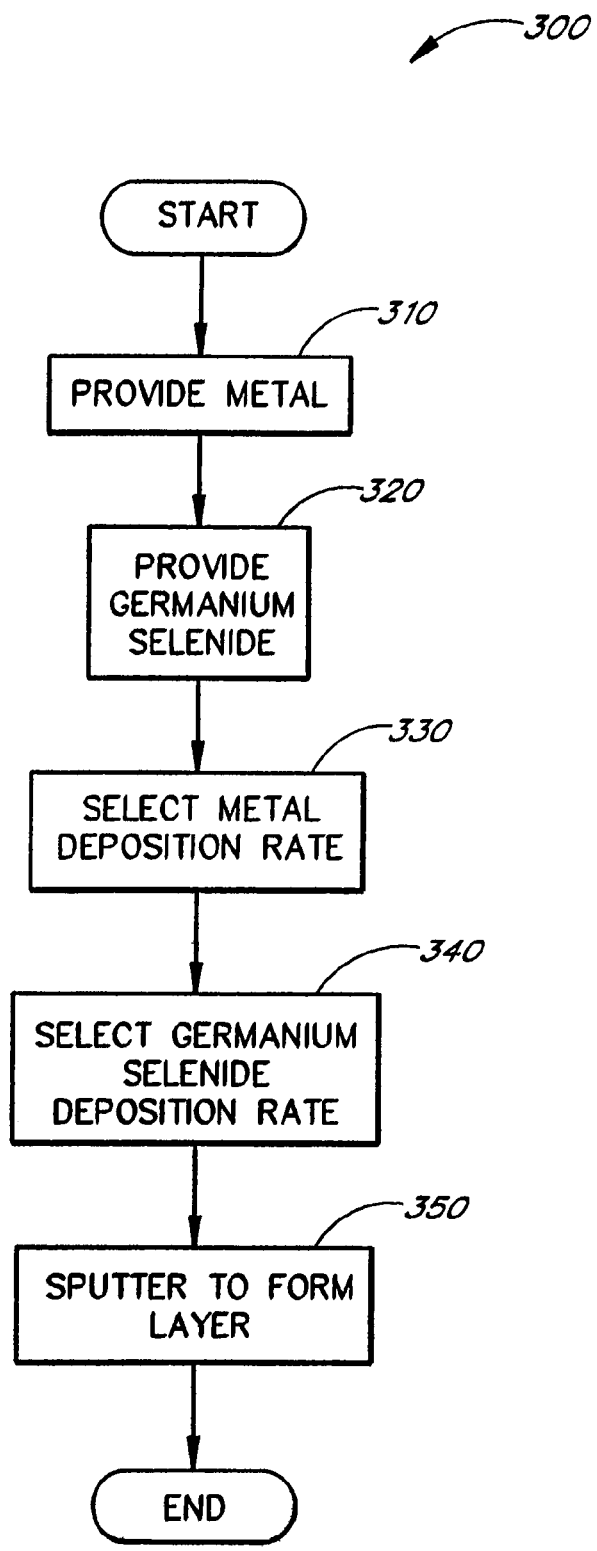
FIG. 3 is a flowchart that generally illustrates a process of co-sputtering metal and germanium selenide ($Ge_xSe_{1-x}$) glass.

FIG. 3 illustrates a process 300 of co-sputtering metal and germanium selenide ($Ge_xSe_{1-x}$) glass. The process provides 310 a metal target from which metal is to sputtered onto a substrate assembly. The metal can be silver (Ag), copper (Cu), or zinc (Zn). The process proceeds to provide 320 a germanium selenide ($Ge_xSe_{1-x}$) target from which germanium selenide ($Ge_xSe_{1-x}$) is to sputtered onto the substrate assembly. In one embodiment, the germanium selenide ($Ge_xSe_{1-x}$) target is a germanium selenide ($Ge_{30}Se_{70}$) target.

The process proceeds to select 330 a deposition rate for the metal .In one embodiment the process selects relatively constant deposition rate for the metal. In another embodiment, the process selects a variable deposition rate for the metal that can be used to vary a doping profile of the metal in the resulting metal-doped germanium selenide ($Ge_xSe_{1-x}$) layer. The deposition rate for the metal is approximately related to the removal rate of material from the metal target. In turn, the removal rate of the material from the metal target is approximately related to the sputter power applied to the metal target. This allows sputter power to control the deposition rate for the metal. It will be understood by one of ordinary skill in the art, however, that the deposition rate versus sputter power varies according to the configuration of the deposition system and the material that is sputtered.

The process selects 340 a deposition rate for germanium selenide ($Ge_xSe_{1-x}$). In one embodiment, the deposition rate for germanium selenide ($Ge_xSe_{1-x}$) is relatively constant. In another embodiment, the deposition rate for germanium selenide ($Ge_xSe_{1-x}$) can vary and can be used to vary the doping profile of the metal in the metal-doped germanium selenide ($Ge_xSe_{1-x}$) layer. The deposition rate for the germanium selenide ($Ge_xSe_{1-x}$) is approximately related to the removal rate of material from the germanium selenide ($Ge_xSe_{1-x}$) target and, in turn, approximately related to the sputter power applied to the germanium selenide ($Ge_xSe_{1-x}$) target. This allows the process to select 340 the deposition rate by a selection of sputter power.

The relative deposition rates between the metal and the germanium selenide ($Ge_xSe_{1-x}$) determine the amount of doping of the metal to the germanium selenide. For example, where a silver (Ag) deposition rate is about 17.8% of the total film deposition, the resulting film is doped at about 32 atomic percent of silver (Ag). In another example, where the silver (Ag) deposition rate is about 9% to about 56% of the total film deposition, the resulting film is doped at about 18.3% to about 69.6% silver (Ag) by atomic percentage.

The process sputters 350 the metal and the germanium selenide ($Ge_xSe_{1-x}$) from their respective targets. In one embodiment, the process sputters 350 metal in accordance with a direct current (DC) sputter process, and the process sputters 350 germanium selenide ($Ge_xSe_{1-x}$) in accordance with a pulse DC sputter process. In a pulse DC sputter process, a positive voltage is periodically applied for a short period of time to the target to reduce or eliminate charge build up in the target. It will be understood by one of ordinary skill in the art that the sputter power used to generate a particular desposition rate will vary depending on the configuration of the deposition system. For the purposes of illustration only, one embodiment of the invention uses 30 Watts (W) of DC sputter to sputter silver (Ag) and sputters germanium selenide ($Ge_{30}Se_{70}$) with 575 W of pulse DC sputter to produce a doped film with about 32% silver (Ag) by atomic weight.

Figure 4:
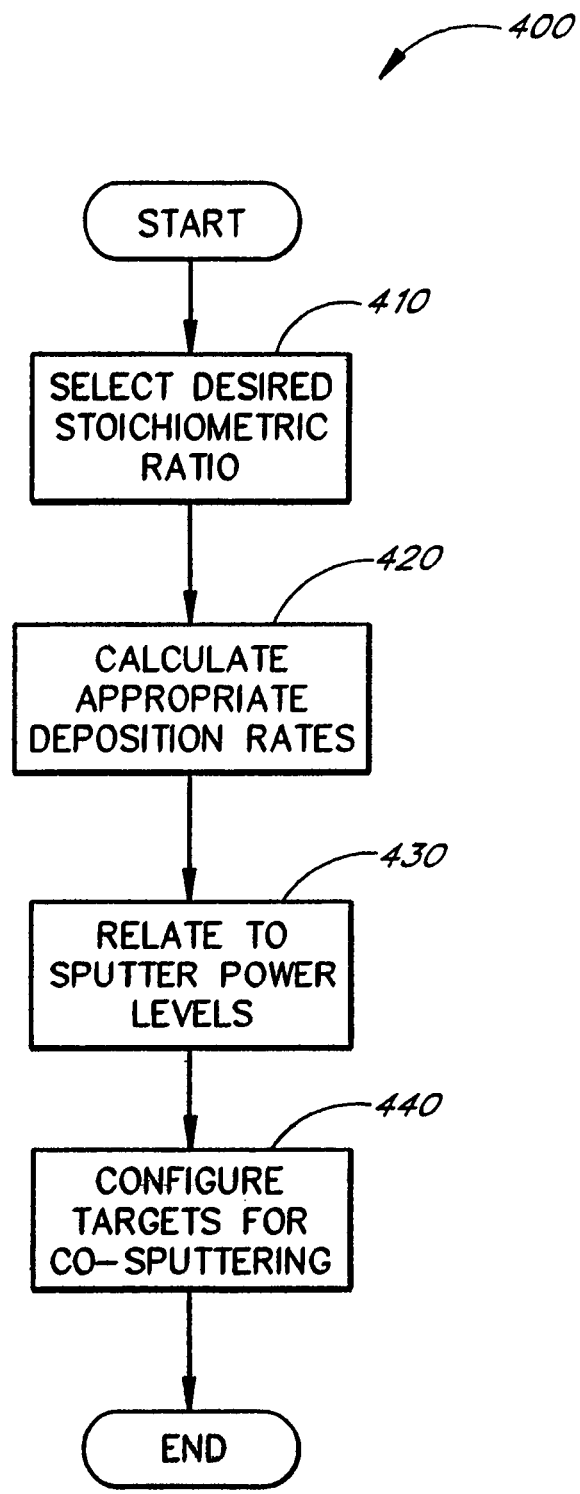
FIG. 4 is a flowchart that generally illustrates a process of configuring a deposition system to co-sputter metal and germanium selenide ($Ge_xSe_{1-x}$) glass.

FIG. 4 illustrates a process 400 of configuring a deposition system to co-sputter metal and germanium selenide ($Ge_xSe_{1-x}$) glass. In one embodiment, the metal is silver (Ag), copper (Cu), or zinc (Zn) and the germanium selenide ($Ge_xSe_{1-x}$) is germanium selenide ($Ge_{30}Se_{70}$). It will be understood that in other embodiments, a different chalcogenide glass substitutes for the germanium selenide ($Ge_xSe_{1-x}$) glass. For example, germanium sulfide ($Ge_xSe_{1-x}$) or arsenic selenide ($As_xSe_{1-x}$) can also be used. The process selects 410 a desired ratio for the metal to the germanium selenide in the active layer. The ratio can be relatively constant to form a relatively uniformly doped layer of metal-doped chalcogenide glass, or can be variable to allow a metal to dope the chalcogenide glass with a selected doping profile.

The process proceeds to calculate 420 a deposition rate for the metal and a deposition rate for the germanium selenide to produce the desired doping of the metal in the germanium selenide ($Ge_xSe_{1-x}$). A broad variety of methods can be used to calculate 420 the deposition rates. In one embodiment, the process calculates 420 the deposition rates by, for example, referring to a lookup table containing pre-calculated deposition rates for particular doping levels. In another embodiment, the process calculates 420 the deposition rates in real time, and scales calculations as necessary to maintain deposition rates within the capabilities of the applicable deposition system.

The process proceeds to relate 430 the specified deposition rates to sputter power levels. Where the deposition rates of the various materials sputtered versus sputter power for the configuration of the deposition system is available, the process can retrieve the sputter power to be used by reference to, for example, a database. The sputter power levels for a given configuration are related to the deposition rates and can be used to control the doping profile of the deposited film. In one embodiment, the process collects and maintains in a database, the configuration of the deposition system and data of deposition rates versus sputter power for a collection of the materials deposited for later retrieval.

The process proceeds to configure 440 a sputtering tool for co-sputtering. In one embodiment, the process configures the tool for DC sputter of the metal target at the specified power level for the desired deposition rate. In one embodiment, the process configures the tool for pulsed DC sputtering of the germanium selenide ($Ge_xSe_{1-x}$) target at the specified power level for the desired deposition rate.

While illustrated primarily in the context of co-sputtering a metal and germanium selenide ($Ge_xSe_{1-x}$) to produce a ternary mixture of a metal-doped chalcogenide glass, it will be understood that the co-sputtering techniques described herein to fabricate a memory cell body are applicable to other combinations suitable for forming metal-doped chalcogenide glass elements.

One combination includes co-sputtering the metal, germanium (Ge), and selenium (Se) from three separate targets. The metal can correspond to a metal that diffuses relatively quickly into the glass, for example, silver (Ag), copper (Cu), and zinc (Zn). Another combination includes co-sputtering a metal selenide, such as $Ag_{y1}Se_{1-y1}$, $Cu_{y2}Se_{1-y2}$, or $Zn_{y3}Se_{1-y3}$, with germanium (Ge) from two separate targets. Another combination includes co-sputtering a germanium metal mixture, such as $Ge_{z1}Ag_{1-z1}$, $Cu_{z2}Ge_{1-z2}$, or $Zn_{z3}Ge_{1-z3}$, and selenium (Se) from two separate targets. In the illustrated equations, the values of y1, y2, y3, z1, z2, and z3 should be maintained such that the deposited material is in an amorphous state. Advantageously, these other combinations can provide the metal-doping of a chalcogenide glass with a relatively high degree of depth-profile uniformity and control.

The chalcogenide glass can also include germanium sulfide ($Ge_xS_{1-x}$) or arsenic selenide ($As_xSe_{1-x}$). Metal-doped germanium sulfide can be formed by co-sputtering metal and germanium sulfide from two separate targets. Another combination includes sputtering a metal sulfide and germanium from two separate targets. Metal-doped arsenic selenide can likewise be formed by co-sputtering metal and arsenic selenide from two separate targets. In another combination, a metal arsenide and selenium are sputtered from two separate targets.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:
1. A nonvolatile memory cell comprising:
a first electrode coupled to a first conductor;
a second electrode coupled to a second conductor, where the first conductor and the second conductor provide access to the memory cell; and a memory cell body disposed between the first electrode and the second electrode, where the memory cell body includes a layer of a chalcogenide glass doped uniformly over depth with a metal.

2. The memory cell as defined in claim 1, wherein the metal comprises silver (Ag).

3. The memory cell as defined in claim 1, wherein the metal is selected from the group consisting of copper (Cu) and zinc (Zn).

4. The memory cell as defined in claim 1, wherein the chalcogenide glass comprises germanium selenide ($Ge_xSe_{1-x}$).

5. The memory cell as defined in claim 1, wherein x is selected such that the layer of germanium selenide ($Ge_xSe_{1-x}$) doped with the metal is amorphous.

* * * * *

UNITED STATES PATENT AND TRADEMARK OFFICE
CERTIFICATE OF CORRECTION

| | | |
|---|---|---|
| PATENT NO. | : 7,446,393 B2 | Page 1 of 2 |
| APPLICATION NO. | : 11/710517 | |
| DATED | : November 4, 2008 | |
| INVENTOR(S) | : Li et al. | |

It is certified that error appears in the above-identified patent and that said Letters Patent is hereby corrected as shown below:

In column 1, line 12, after "6,825,135" insert -- , --.

In column 8, line 63, in Claim 1, after "A" delete "nonvolatile".

In column 9, line 1, in Claim 1, after "body" delete "disposed".

In column 9, line 2, in Claim 1, delete "where" and insert -- wherein --, therefor.

In column 9, line 3, in Claim 1, after "chalcogenide" delete "glass" and insert -- glass, said chalcogenide glass layer having a thickness and being --, therefor.

In column 9, line 4, in Claim 1, after "uniformly" delete "over depth".

In column 9, line 4, in Claim 1, delete "metal." and insert -- metal across said thickness. --, therefor.

In column 9, line 5, in Claim 2, delete "as defined in" and insert -- of --, therefor.

In column 9, line 6, in Claim 2, delete "silver (Ag)." and insert -- silver. --, therefor.

In column 9, line 7, in Claim 3, delete "as defined in" and insert -- of --, therefor.

In column 9, line 8, in Claim 3, after "copper" delete "(Cu)".

In column 9, lines 8-9, in Claim 3, after "and" delete "zinc (Zn)." and insert -- zinc. --, therefor.

In column 10, line 1, in Claim 4, delete "as defined in" and insert -- of --, therefor.

In column 10, lines 2-3, in Claim 4, delete "selenide ($Ge_xSe_{1-x}$)." and insert -- selenide. --, therefor.

In column 10, line 4, in Claim 5, delete "as defined in" and insert -- of --, therefor.

UNITED STATES PATENT AND TRADEMARK OFFICE
CERTIFICATE OF CORRECTION

PATENT NO. : 7,446,393 B2
APPLICATION NO. : 11/710517
DATED : November 4, 2008
INVENTOR(S) : Li et al.

It is certified that error appears in the above-identified patent and that said Letters Patent is hereby corrected as shown below:

In column 10, line 4, in Claim 5, after "wherein" insert -- the germanium selenide has the formula $Ge_xSe_{1-x}$ and --.

In column 10, line 5, in Claim 5, after "selenide" delete "$(Ge_xSe_{1-x})$" and insert -- is amorphous when --, therefor.

In column 10, line 6, in Claim 5, delete "metal is amorphous." and insert -- metal. --, therefor.

Signed and Sealed this

Third Day of March, 2009

JOHN DOLL
*Acting Director of the United States Patent and Trademark Office*